US012626664B2

(12) United States Patent (10) Patent No.: US 12,626,664 B2
Xu et al. (45) Date of Patent: May 12, 2026

(54) ARRAY SUBSTRATE, DISPLAY PANEL AND DISPLAY ASSEMBLY

(71) Applicant: Suzhou Govisionox Innovation Technology Co., Ltd., Kunshan (CN)

(72) Inventors: Chuanzhi Xu, Kunshan (CN); Yanqin Song, Kunshan (CN); Yong Wu, Kunshan (CN); Siming Hu, Kunshan (CN)

(73) Assignee: Suzhou Govisionox Innovation Technology Co., Ltd., Kunshan (CN)

( * ) Notice: Subject to any disclaimer, the term of this patent is extended or adjusted under 35 U.S.C. 154(b) by 0 days.

(21) Appl. No.: 18/951,596

(22) Filed: Nov. 18, 2024

(65) Prior Publication Data

US 2025/0078760 A1 Mar. 6, 2025

(30) Foreign Application Priority Data

Dec. 29, 2023 (CN) .......................... 202311862940.7

(51) Int. Cl.
| *G09G 3/3241* | (2016.01) |
| *G09G 3/3233* | (2016.01) |
| *H10K 59/12* | (2023.01) |
| *H10K 59/121* | (2023.01) |
(Continued)

(52) U.S. Cl.
CPC ......... *G09G 3/3241* (2013.01); *G09G 3/3233* (2013.01); *H10K 59/12* (2023.02); *H10K 59/121* (2023.02); *H10K 59/131* (2023.02); *G09G 2300/0426* (2013.01); *G09G 2300/0819* (2013.01); *G09G 2300/0842* (2013.01);
(Continued)

(58) Field of Classification Search
None
See application file for complete search history.

(56) References Cited

U.S. PATENT DOCUMENTS

| 9,147,723 B1 * | 9/2015 | Lee ......................... G09G 3/006 |
| 10,650,742 B2 * | 5/2020 | Chaji .................... G06F 1/3218 |
| 11,893,937 B2 * | 2/2024 | Zhang ................... G09G 3/3233 |
(Continued)

FOREIGN PATENT DOCUMENTS

| CN | 115171588 A | 10/2022 |
| CN | 116246564 A | 6/2023 |
| KR | 20230140545 A | 10/2023 |

OTHER PUBLICATIONS

Request for the Submission of an Opinion of Application No. KR 10-2024-0160713.

*Primary Examiner* — Patrick N Edouard
*Assistant Examiner* — Peijie Shen
(74) *Attorney, Agent, or Firm* — Kilpatrick Townsend & Stockton LLP

(57) ABSTRACT

Provided are an array substrate, a display panel and a display assembly. The array substrate includes: a plurality of repeating units, where the plurality of repeating units are arranged in an array, each of the plurality of repeating units includes two pixel circuits disposed in two adjacent columns, and each of the two pixel circuits includes a plurality of function circuits; and a plurality of first signal lines extending in a column direction, where a plurality of function circuits in repeating units of each column are connected to a respective first signal line, and the plurality of function circuits in each of the plurality of repeating units are connected to the same first signal line.

18 Claims, 7 Drawing Sheets

(51) Int. Cl.
    *H10K 59/126*         (2023.01)
    *H10K 59/131*         (2023.01)

(52) U.S. Cl.
    CPC .............. *G09G 2300/0861* (2013.01); *G09G*
        *2320/045* (2013.01); *H10K 59/126* (2023.02)

(56)             References Cited

U.S. PATENT DOCUMENTS

| | | | | |
|---|---|---|---|---|
| 2012/0105412 A1* | 5/2012 | Kang | .................. | G09G 3/3233 |
| | | | | 345/76 |
| 2014/0132584 A1* | 5/2014 | Kim | ..................... | G09G 3/3696 |
| | | | | 345/82 |
| 2014/0299843 A1* | 10/2014 | Kim | ....................... | H10D 1/692 |
| | | | | 438/23 |
| 2015/0009108 A1* | 1/2015 | Song | .................... | G09G 3/3225 |
| | | | | 345/80 |
| 2016/0210896 A1* | 7/2016 | Gil | ..................... | H10K 59/1216 |
| 2017/0221423 A1* | 8/2017 | Xiang | .................. | G09G 3/3233 |
| 2017/0309227 A1* | 10/2017 | Ebisuno | .............. | H10K 59/131 |
| 2019/0088208 A1* | 3/2019 | Chang | .................. | G09G 3/3266 |
| 2019/0228726 A1* | 7/2019 | Ono | ...................... | G09G 3/3291 |
| 2020/0083309 A1* | 3/2020 | Wang | ................... | H10D 86/423 |
| 2021/0210022 A1* | 7/2021 | Chang | .................. | G09G 3/3266 |
| 2022/0199007 A1* | 6/2022 | Zhao | .................... | H10K 59/131 |
| 2023/0253414 A1* | 8/2023 | Kim | ..................... | G09G 3/3233 |
| | | | | 345/205 |
| 2025/0006132 A1* | 1/2025 | Guo | ........................ | H10K 59/12 |
| 2025/0031531 A1* | 1/2025 | Han | .................... | H10K 59/122 |

* cited by examiner

ARRAY SUBSTRATE, DISPLAY PANEL AND DISPLAY ASSEMBLY

CROSS-REFERENCE TO RELATED APPLICATION

This application claims priority to Chinese Patent Application No. 202311862940.7 filed Dec. 29, 2023, the disclosure of which is incorporated herein by reference in its entirety.

TECHNICAL FIELD

The present disclosure relates to the field of display technology and, in particular, to an array substrate, a display panel and a display assembly.

BACKGROUND

With the development of display technology, array substrates are widely applied, and accordingly, the requirements for the array substrates become increasingly high.

However, it is difficult to improve the yield and pixels per inch (PPI, or pixel density) of existing array substrates at the same time, thereby limiting the application of the array substrates.

SUMMARY

The present disclosure provides an array substrate, a display panel and a display assembly to improve both the yield and the pixel density of array substrates.

According to one aspect of the present disclosure, an array substrate is provided. The array substrate includes multiple repeating units and multiple first signal lines.

The multiple repeating units are arranged in an array, each repeating unit includes two pixel circuits disposed in two adjacent columns, and each pixel circuit includes multiple function circuits.

The first signal lines extend in the column direction. The multiple function circuits in the repeating units of each column are connected to a respective first signal line of the first signal lines, and the multiple function circuits in each repeating unit are connected to the same first signal line.

Optionally, each first signal line is disposed between two pixel circuits of a respective one of the repeating units, and the first signal lines are insulated from each other.

Preferably, the array substrate further includes a plurality of first via holes, the multiple function circuits in each repeating unit are connected to a first signal line through a respective one of the first via holes, and the first via hole corresponding to the multiple function circuits in each repeating unit is disposed between the two pixel circuits of each repeating unit.

Preferably, the multiple function circuits in each pixel circuit at least include a first initialization circuit and a second initialization circuit. In each repeating unit, the first initialization circuits in two pixel circuits are connected to the first signal line through the one first via hole, and the second initialization circuits in two pixel circuits are connected to the respective first signal line through another one first via hole.

Preferably, for the repeating units in two adjacent rows and a same column, the first initialization circuit in each pixel circuit in an i-th row and a j-th column and the second initialization circuit in each pixel circuit in an (i+1)-th row and the j-th column are connected to the respective first signal line through the same first via hole; or the first initialization circuit and a second initialization circuit in each pixel circuit in the i-th row and the j-th column are connected to the respective first signal line through different first via holes. Where i is a positive integer greater than or equal to 1, and j is a positive integer greater than or equal to 1.

Preferably, each pixel circuit further includes a light-emitting element and a drive circuit. The first initialization circuit is used for initializing a first electrode of the light-emitting element, and the second initialization circuit is used for initializing the drive circuit.

Preferably, both the first initialization circuit and the second initialization circuit include a transistor, the transistor includes a channel, and the channel of the first initialization circuit in the pixel circuit in the i-th row and the j-th column is disposed on a side, facing the first via hole, of the channel of the second initialization circuit in the pixel circuit in the (i+1)-th row and the j-th column.

Preferably, both the first initialization circuit and the second initialization circuit include a transistor, the transistor includes a channel, and the channel of the first initialization circuit in the pixel circuit in the i-th row and the j-th column is disposed on a side of the channel of the second initialization circuit in the pixel circuit in the (i+1)-th row and the j-th column closest the first signal line.

Optionally, each of the first initialization circuit and the second initialization circuit includes a transistor, the transistor includes a channel, and the channel of the first initialization circuit in a repeating unit in a first row and the channel of the second initialization circuit in a repeating unit in a second row are arranged in the row direction.

Preferably, the array substrate includes multiple scanning signal lines extending in the row direction, and the scanning signal lines and the first signal lines are disposed in different conductive layers; the channel of the first initialization circuit in the repeating unit in the first row and the channel of the second initialization circuit in the repeating unit in the second row overlap the same scanning signal line.

Preferably, the array substrate includes multiple scanning signal lines extending in the row direction, and the scanning signal lines and the first signal lines are disposed in different conductive layers; the channel of the first initialization circuit in the repeating unit in the first row and the channel of the second initialization circuit in the repeating unit in the second row overlap different scanning signal lines, respectively.

Optionally, two pixel circuits in each repeating unit are mirror-symmetric.

Preferably, each first signal line is disposed on the center line of the two pixel circuits of the respective repeating unit.

Optionally, for pixel circuits in the same column in the repeating units in two adjacent rows, the first initialization circuit in the pixel circuit in the i-th row and the j-th column and the second initialization circuit in the pixel circuit in the (i+1)-th row and the j-th column are connected to a respective one of the first signal lines through the same via hole.

Each repeating unit is provided with two first conductive structure and a second conductive structure disposed between the two pixel circuits of each repeating unit. The second conductive structure is connected to the first signal line through the first via hole. One of the two first conductive structures is connected to the first initialization circuit in the pixel circuit in the i-th row and the j-th column and the second initialization circuit in the pixel circuit in the (i+1)-th row and the j-th column and is connected to the second conductive structure. The other one of the two first conductive structures is connected to a first initialization circuit in a pixel circuit in the i-th row and a (j+1)-th column and a second initialization circuit in a pixel circuit in the (i+1)-th row and the (j+1)-th column and is connected to the second conductive structure.

The first conductive structure connected to the first initialization circuit does not overlap a conductive signal line.

Preferably, the conductive signal line includes a first signal line, a data line and a power signal line.

Preferably, the first conductive structure extends in the row direction.

Preferably, the first conductive structure and the second conductive structure are disposed in the same layer.

Preferably, the array substrate includes an active layer, a first conductive layer, and a second conductive layer, and the first conductive structure and the second conductive structure are disposed in the active layer.

Optionally, the array substrate further includes multiple data lines extending in the column direction, and pixel circuits of each column are connected to a respective one of the data lines.

Preferably, two data lines are disposed between every two adjacent columns of repeating units.

Preferably, two data lines are disposed between every two adjacent first signal lines.

Preferably, the data lines and the first signal lines are disposed in the same layer.

Preferably, the array substrate includes an active layer, a first conductive layer, and a second conductive layer, and the data lines and the first signal lines are disposed in the second conductive layer.

Optionally, the array substrate further includes at least one shielding structure disposed between two adjacent columns of repeating units. In the thickness direction of the array substrate, the projection of two data lines between two adjacent columns of repeating units overlaps the projection of the shielding structure.

Preferably, the array substrate includes an active layer, a first conductive layer, and a second conductive layer, the data lines are disposed in the second conductive layer, and the shielding structure is disposed in the active layer or the first conductive layer.

Preferably, the shielding structure accesses a fixed potential.

Preferably, the array substrate further includes a plurality of power signal lines extending in the column direction and at least one second via hole. The power signal line is used for supplying a power signal to a respective column of the pixel circuits. The power signal line and the shielding structure are disposed in different layers, and the shielding structure is connected to the power signal line through the second via hole.

Preferably, the array substrate further includes at least one coupling suppression structure extending in the column direction and disposed between two adjacent columns of repeating units in the same row. The coupling suppression structure and the data lines are disposed in different layers, and in a plan view the coupling suppression structure is located between two data lines disposed between two adjacent columns of repeating units.

Preferably, the array substrate includes an active layer, a first conductive layer, and a second conductive layer, the data lines are disposed in the second conductive layer, and the coupling suppression structure is disposed in the active layer or the first conductive layer.

Preferably, the coupling suppression structure is integrated with the shielding structure.

Preferably, the array substrate further includes a scanning signal line and an enable signal line both extending in the row direction. In the thickness direction of the array substrate, the coupling suppression structure or the shielding structure is spaced from the projection of the scanning signal line and the projection of the enable signal line.

Optionally, the array substrate further includes multiple power signal lines extending in the column direction. The pixel circuits of each column are connected to a respective one of the power signal lines, and each power signal line is used for supplying a power signal to the pixel circuits.

Preferably, the power signal lines and the first signal lines are disposed in the same layer.

Preferably, the array substrate includes an active layer, a first conductive layer, and a second conductive layer, and the first signal lines and the power signal lines are disposed in the second conductive layer.

Preferably, the array substrate further includes a plurality of power bonding lines disposed in the first conductive layer, and two adjacent power signal lines are connected to each other through the power bonding line.

Preferably, each first signal line is disposed between two adjacent power signal lines.

Preferably, two data lines between two adjacent columns of repeating units are disposed between two adjacent power signal lines.

Preferably, each pixel circuit includes a light-emitting element, a drive circuit, the first initialization circuit, the second initialization circuit, a threshold compensation circuit, a data write circuit, a first light emission control circuit, a second light emission control circuit, and a storage capacitor.

A control terminal of the drive circuit is connected to a first terminal of the storage capacitor, a first terminal of the drive circuit is connected to a second terminal of the first light emission control circuit, and a second terminal of the drive circuit is connected to a first terminal of the threshold compensation circuit.

A first terminal of the data write circuit is connected to a corresponding data line, a second terminal of the data write circuit is connected to the first terminal of the drive circuit, and a control terminal of the data write circuit is connected to a second scanning signal line.

A second terminal of the threshold compensation circuit is connected to the control terminal of the drive circuit, and a control terminal of the threshold compensation circuit is connected to the second scanning signal line.

A first terminal of the second initialization circuit is connected to a corresponding first signal line, a second terminal of the second initialization circuit is connected to the control terminal of the drive circuit, and a control terminal of the second initialization circuit is connected to a first scanning signal line.

A first terminal of the first initialization circuit is connected to the first signal line, a second terminal of the first initialization circuit is connected to the anode of the light-emitting element, and a control terminal of the first initialization circuit is connected to a third scanning signal line.

A first terminal of the first light emission control circuit is connected to a power signal line, and a control terminal of the first light emission control circuit is connected to an enable signal line.

A first terminal of the second light emission control circuit is connected to the second terminal of the drive circuit, a second terminal of the second light emission control circuit is connected to the anode of the light-emitting element, and a control terminal of the second light emission control circuit is connected to the enable signal line.

A second terminal of the storage capacitor is connected to the power signal line.

Preferably, the array substrate includes an active layer, a first conductive layer, and a second conductive layer; the first scanning signal line, the second scanning signal line, the third scanning signal line, and the enable signal line are disposed in the first conductive layer; the power signal line, the first signal line, and the data line are disposed in the second conductive layer.

Preferably, the second initialization circuit is a double-gate transistor.

Preferably, the threshold compensation circuit is a double-gate transistor.

According to another aspect of the present disclosure, a display panel is provided. The display panel includes the array substrate described above.

According to another aspect of the present disclosure, a display assembly is provided. The display assembly includes the display panel described above.

In the solutions of the embodiments of the present disclosure, the adopted array substrate includes multiple repeating units. The multiple repeating units are arranged in an array, each repeating unit includes two pixel circuits disposed in two adjacent columns, and each pixel circuit includes multiple function circuits. The array substrate further includes multiple first signal lines extending in the column direction. The multiple function circuits in the repeating units of each column are connected to a respective one of the first signal lines. By setting each column of repeating units to correspond to one first signal line, the number of first signal lines can be reduced, thereby improving both the yield and the pixel density of the array substrate. Furthermore, by sharing a via hole, the uniformity of the initialization effect of each pixel circuit can be improved, thereby improving the display uniformity of the array substrate.

It is to be understood that the content described in this section is neither intended to identify key or critical features of the embodiments of the present disclosure nor intended to limit the scope of the present disclosure. Other features of the present disclosure become easily understood through the description provided hereinafter.

BRIEF DESCRIPTION OF DRAWINGS

To illustrate solutions in embodiments of the present disclosure more clearly, the drawings used in the description of the embodiments are briefly described below. Apparently, the drawings described below only illustrate part of the embodiments of the present disclosure, and those of ordinary skill in the art may obtain other drawings based on the drawings described below on the premise that no creative work is done.

DETAILED DESCRIPTION

As mentioned in the Background, it is difficult to improve the yield and the pixel density of the existing array substrate at the same time. However, the inventors have found through study that the reason for the above problem is that the array substrate generally includes conductive layers and many signal lines are disposed in the same conductive layer. To improve the yield, the line width and the line spacing of the signal lines in the same conductive layer need to be increased, which makes it impossible to improve the pixel density; to improve the pixel density, the line width and line spacing need to be reduced, which in turn reduces the yield.

To solve the above problem, the present disclosure proposes the following solutions.

Figure 1:
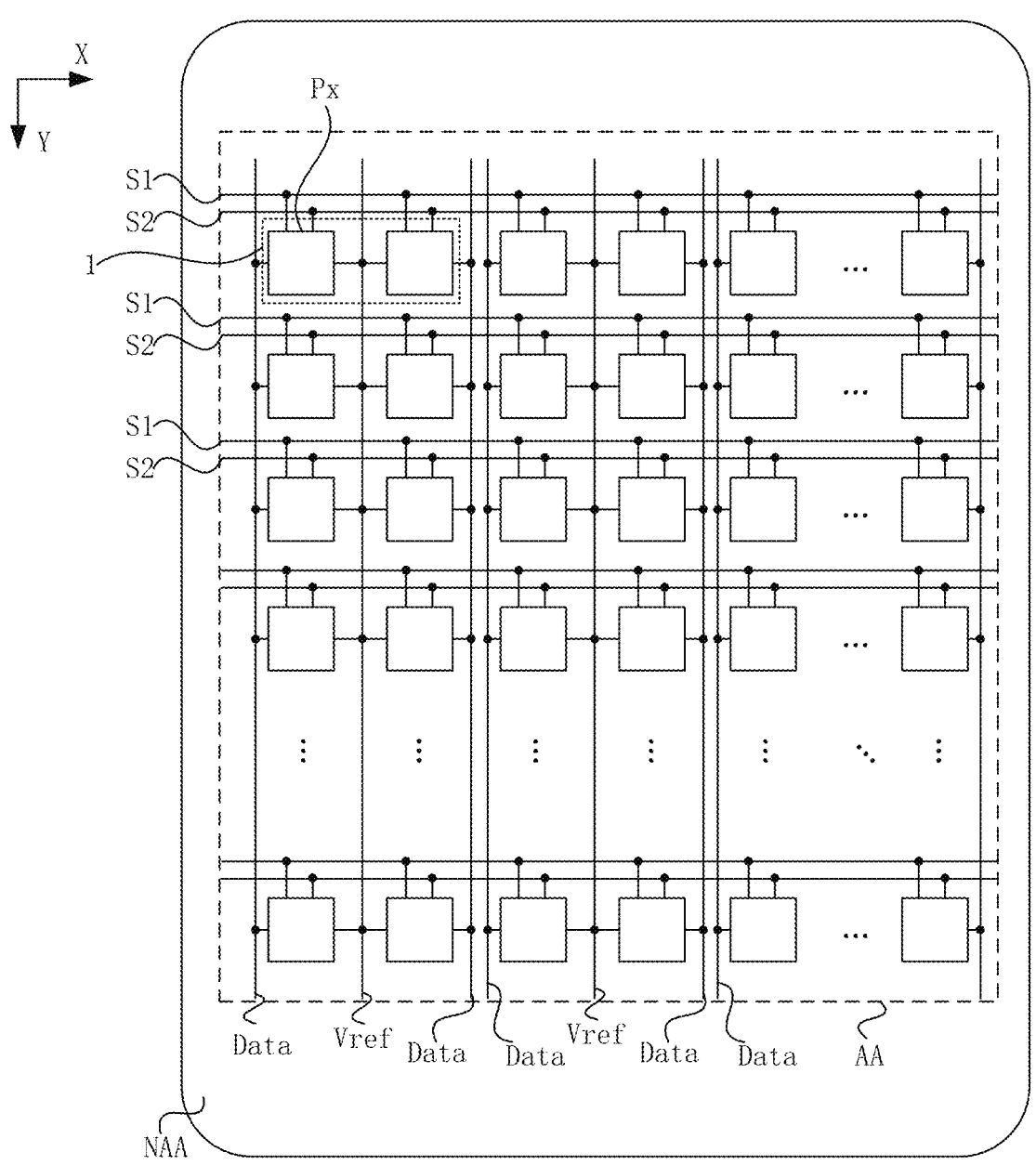
FIG. 1 is a schematic diagram of the circuit structure of an array substrate according to an embodiment of the present disclosure.

FIG. 1 is a schematic diagram of the circuit structure of an array substrate according to an embodiment of the present disclosure. With reference to FIG. 1, the array substrate includes multiple repeating units 1. The multiple repeating units 1 are arranged in an array. Each repeating unit 1 includes two pixel circuits Px disposed in two adjacent columns, and each pixel circuit Px includes multiple function circuits. The array substrate further includes multiple first signal lines Vref extending in the column direction Y. The multiple function circuits in the repeating units 1 of each column are connected to a respective one of the first signal lines Vref, and the multiple function circuits in each repeating unit 1 are connected to the same first signal line Vref.

Specifically, the pixel circuit includes different function circuits, and the different function circuits are used for executing different functions, for example, the function circuits are used for initializing different parts of the pixel circuit. The first signal line supplies a corresponding signal, for example, the first signal line supplies a control signal or a drive signal to corresponding repeating units. Where the control signal is used for controlling a corresponding function circuit to be turned on or off, and the drive signal is transmitted to a corresponding part of the pixel circuit through the function circuit.

In this embodiment, each column of repeating units 1 corresponds to one first signal line Vref, and each column of repeating units 1 include two columns of pixel circuits Px, that is, each two columns of pixel circuits Px correspond to one first signal line Vref. Compared with the case in which each column of pixel circuits Px corresponds to one first signal line Vref, the number of the first signal lines Vref can be reduced by half, thereby reducing the number of signal lines extending in the column direction Y in the array substrate. The saved space can be used to increase the line width and the line spacing of other signal lines, thereby improving the yield of the array substrate. In addition, the saved space can also be used to improve the pixel density. Alternatively, part of the saved space is used to increase the line width and the line spacing, and the other part is used to increase the pixel density, thereby improving both the pixel density and the yield. Further, with the setting in which the multiple function circuits at least include a first initialization circuit and a second initialization circuit as an example, in this embodiment, the first initialization circuit and the second initialization circuit of the pixel circuit Px are connected to the same first signal line Vref. Compared with the case in which each initialization circuit is connected to one first signal line Vref, the number of the first signal lines Vref can be further reduced, thereby reducing the number of signal lines extending in the column direction Y in the array substrate.

Figure 2:
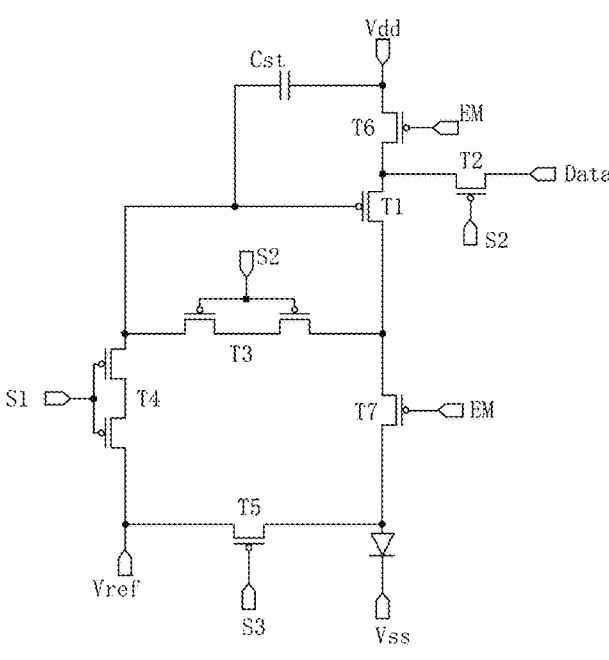
FIG. 2 is a schematic diagram of the circuit structure of a pixel circuit according to an embodiment of the present disclosure.

FIG. 2 is a schematic diagram of the circuit structure of a pixel circuit according to an embodiment of the present disclosure. With reference to FIGS. 1 and 2, each pixel circuit Px includes a first initialization circuit (exemplarily, the first initialization circuit includes a first initialization transistor T5) and a second initialization circuit (exemplarily, the second initialization circuit includes a second initialization transistor T4). The first initialization transistor T4 and the second initialization transistor T5 are used for initializing different parts of the pixel circuit Px. Each first signal line Vref is disposed between two pixel circuits Px of a respective one of the repeating units 1, and the first signal lines Vref are insulated from each other.

The array substrate further includes a plurality of first via holes K1. The multiple function circuits in each repeating unit 1 are connected to the first signal line Vref through a respective first via hole K1, and the first via hole K1 corresponding to the multiple function circuits in each repeating unit 1 is disposed between the two pixel circuits Px of each repeating unit 1. In the repeating unit 1, the first initialization circuits T5 in two pixel circuits Px are connected to a respective one of the first signal lines Vref through one first via hole, and the second initialization circuits T4 in two pixel circuits Px are connected to a respective one of the first signal lines Vref through another one first via hole.

Specifically, as shown in FIG. 1, the array substrate may include a display area AA and a non-display area NAA at least partially surrounding the display area AA. Multiple pixel circuits Px arranged in an array are disposed in the display area AA. Multiple first scanning signal lines S1 and multiple second scanning signal lines S2 extending in the row direction X are further disposed in the display area AA. Each row of pixel circuits Px is connected to a respective one of the first scanning signal lines S1 and a respective one of the second scanning signal lines S2. In this embodiment, the pixel circuit Px includes a first initialization transistor T5 and a second initialization transistor T4. The two initialization transistors initialize different parts of the pixel circuit. For example, the first initialization transistor T5 initializes a first electrode of a light-emitting element in the pixel circuit, and the second initialization transistor T4 initializes the gate of a drive transistor T1 in the pixel circuit, where the first electrode of the light-emitting element may be an anode, and the second electrode may be a cathode. In some embodiments, the first scanning signal line S1 drives two adjacent rows of pixel circuits Px. In this manner, the first scanning signal line S1 drives the first initialization transistors T5 in the pixel circuits in an i-th row and the second initialization transistors T4 in the pixel circuits in an (i+1)-th row, that is, the first scanning signal line S1 corresponding to the two rows of pixel circuits Px is reused, thereby reducing the number of scanning signal lines and improving the pixel density. Of course, in some other embodiments, each row of pixel circuits may correspond to three scanning signal lines. The first scanning signal line S1 drives the second initialization transistor T4, the second scanning signal line S2 drives a data write transistor T2, and the third scanning signal line S3 drives the first initialization transistor T5. The scanning signal lines corresponding to each row of pixel circuits Px are not reused. A gate driver circuit may be disposed in the non-display area for supplying corresponding scanning signals to scanning signal lines and, of course, also for supplying corresponding enable signals to enable signal lines. It is to be understood that the non-display areas on both sides of the display area AA may be provided with gate driver circuits to reduce the voltage drop on the scanning signal lines and the voltage drop on the enable signal lines, thereby improving the display uniformity.

The display area AA further includes multiple data lines Data extending in the column direction Y, and pixel circuits Px of each column are connected to a respective one of the data lines Data. The data signal Data is used for supplying a data signal to the pixel circuits Px. The display panel may typically include light-emitting elements of three colors, such as red light-emitting elements, green light-emitting elements, and blue light-emitting elements.

The light-emitting element may be an organic light-emitting diode (OLED), a Micro-light-emitting diode (LED), a quantum-dot light-emitting diode (QLED) or a Mini-LED. With the setting in which the light-emitting element is an OLED as an example, the OLED typically includes an anode layer, a hole injection layer, a hole transport layer, an electron blocking layer, a light-emitting layer, a hole blocking layer, an electron transport layer, an electron injection layer, and a cathode layer, and the light-emitting elements emit different colors by using different light-emitting layer materials.

In this embodiment, each column of repeating units 1 corresponds to one first signal line Vref, and the first signal line Vref may be an initialization signal line for transmitting an initialization signal. Since each column of repeating units 1 includes two columns of pixel circuits Px, each two columns of pixel circuits Px correspond to one first signal line Vref. Compared with the case in which each column of pixel circuits Px corresponds to one first signal line Vref, the number of the first signal lines Vref can be reduced by half, thereby reducing the number of signal lines extending in the column direction Y in the array substrate. The saved space can be used to increase the line width and the line spacing of other signal lines, thereby improving the yield of the array substrate. Further, in this embodiment, the first initialization circuit and the second initialization circuit of the pixel circuit Px are connected to the same first signal line Vref. Compared with the case in which each initialization circuit is connected to one first signal line Vref, the number of the first signal lines Vref can be further reduced, thereby reducing the number of signal lines extending in the column direction Y in the array substrate.

In this embodiment, the multiple first signal lines Vref are insulated from each other, which means that any two first signal lines Vref are not connected to each other through a lateral (that is, in the row direction) lead in the display area AA. However, in the non-display area NAA, the first signal lines Vref may be connected to each other through corresponding leads and then connected to a driver chip, and, of course, the first signal lines Vref may be directly connected to the driver chip. Further, in the same repeating unit 1, the first initialization circuits in two pixel circuits Px are connected to the first signal line Vref through the same first via hole, and the second initialization circuits in two pixel circuits Px are connected to the first signal line Vref through the same first via hole. In other words, in a first aspect, the first signal line Vref is disposed between two columns of pixel circuits Px in the repeating unit 1, one first signal line Vref only supplies a corresponding initialization signal to one column of repeating units 1 (that is, the two columns of pixel circuits Px), and since there is no lateral lead, the first signal line Vref does not supply the initialization signal to other columns of pixel circuits Px through the lateral lead, thereby making the length of the lead from each pixel circuit Px in different columns of repeating units 1 to a respective one of the first signal lines Vref close to each other. In a second aspect, the two first initialization circuits in the repeating unit 1 are connected to the first signal line Vref through one first via hole, and the two second initialization circuits are also connected to the first signal line Vref through another one first via hole, thereby making the length of the lead from the first initialization circuit in each pixel circuit Px of the same repeating unit 1 to the first signal line Vref close to each other and the length of the lead from each second initialization circuit in the same repeating unit 1 to the first signal line Vref close to each other. With the joint effect of the above aspects, the initialization effect of each pixel circuit Px is closer to each other, thereby further improving the display uniformity.

Figure 3:
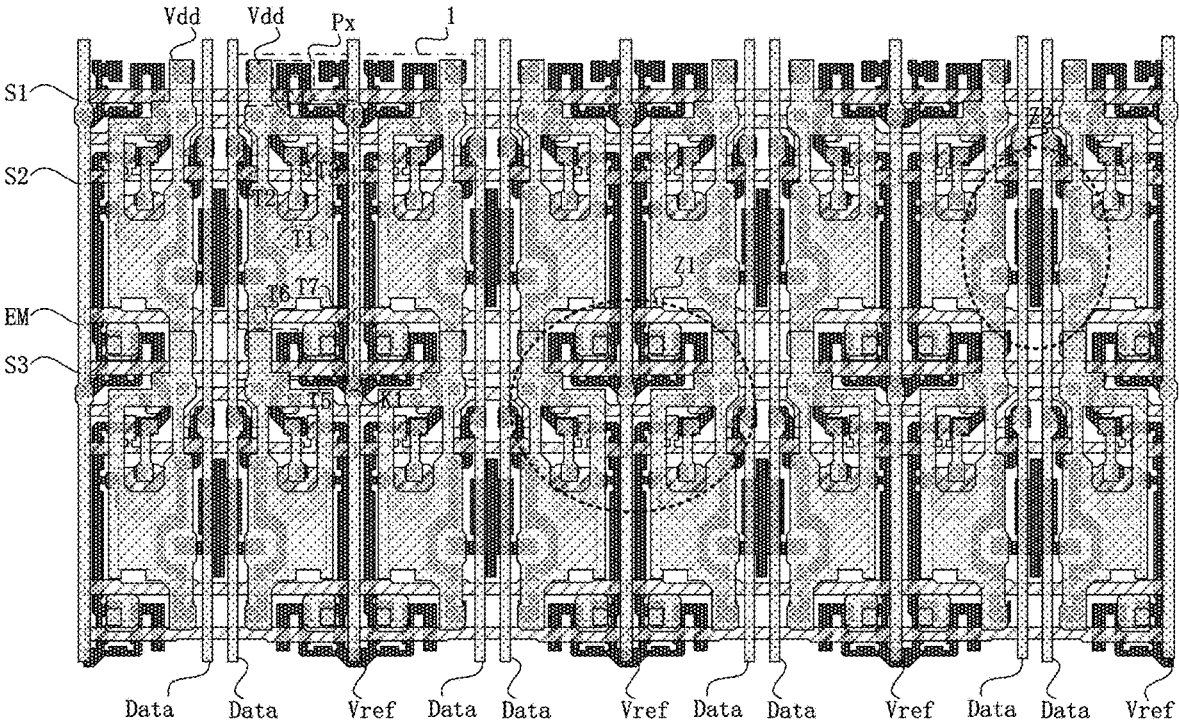
FIG. 3 is a schematic diagram of a layout structure of the array substrate according to an embodiment of the present disclosure.
Figure 4:
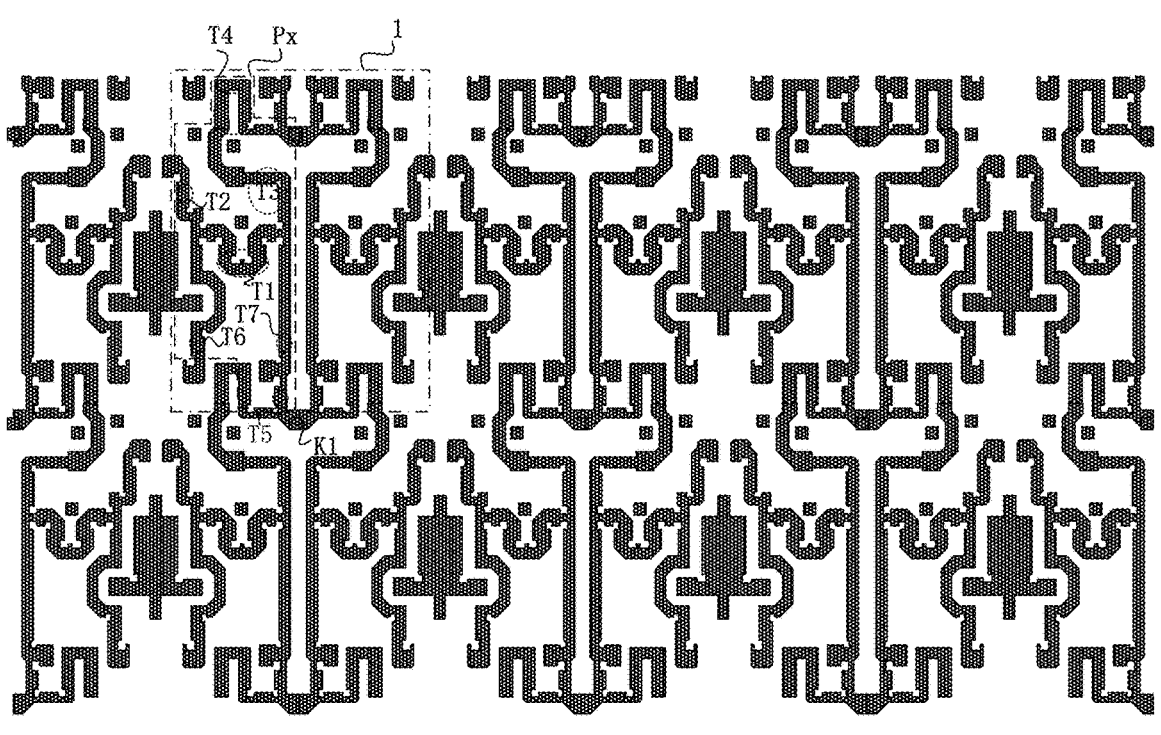
FIG. 4 is a schematic diagram of the structure of an active layer of the array substrate according to an embodiment of the present disclosure.
Figure 5:
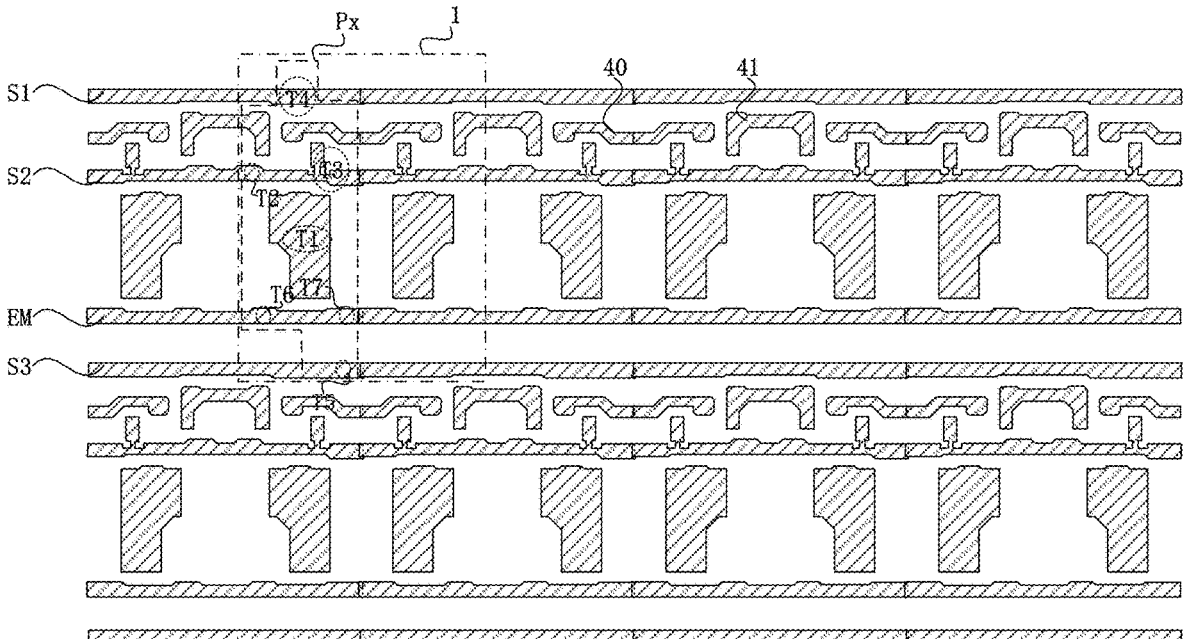
FIG. 5 is a schematic diagram of the structure of a first conductive layer of the array substrate according to an embodiment of the present disclosure.
Figure 6:
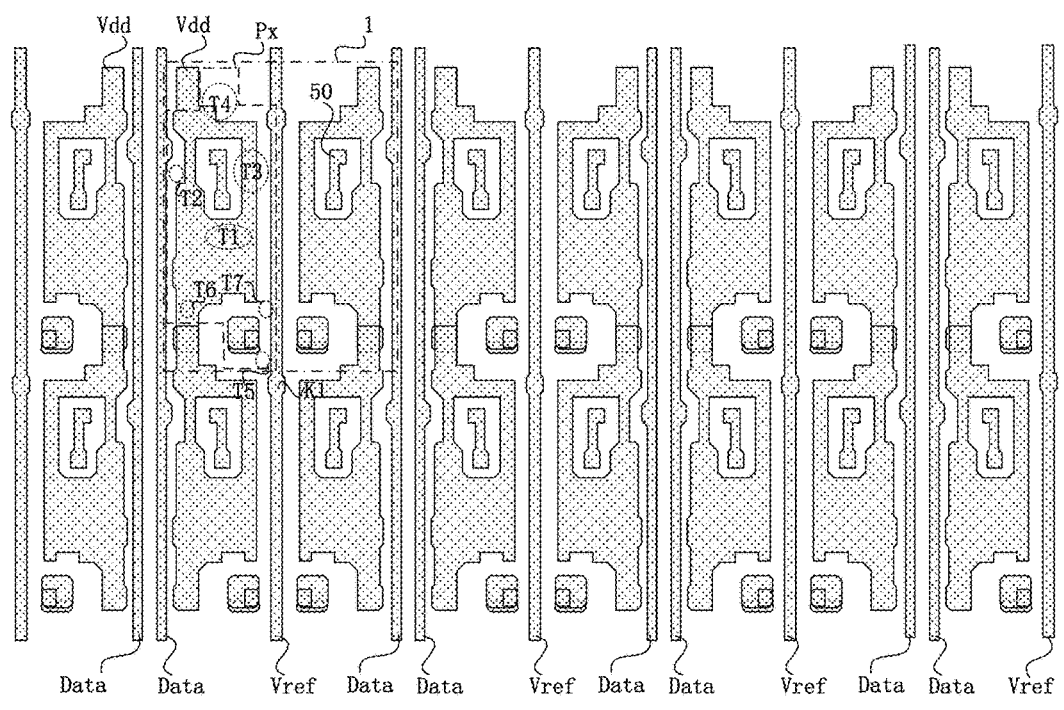
FIG. 6 is a schematic diagram of the structure of a second conductive layer of the array substrate according to an embodiment of the present disclosure.
Figure 7:
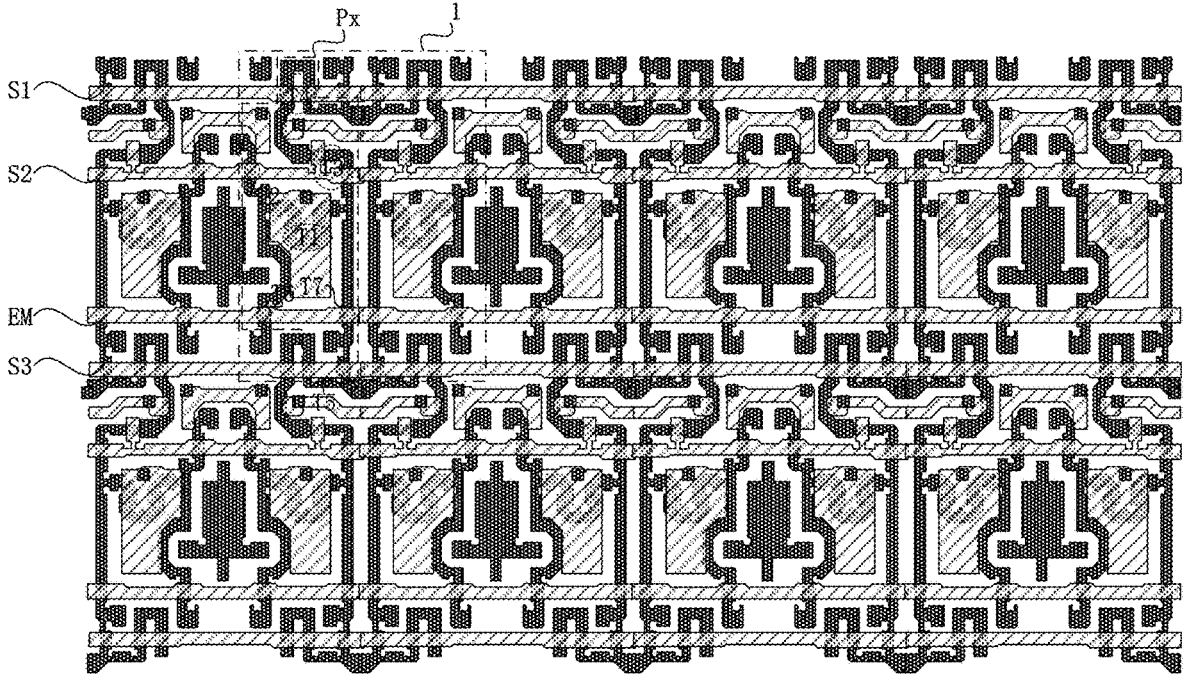
FIG. 7 is a schematic diagram of the structure of the active layer stacked with the first conductive layer of the array substrate according to an embodiment of the present disclosure.

Exemplarily, the pixel circuit illustrated in FIG. 2 includes seven transistors and one capacitor, which is often referred to by those skilled in the art as a 7T1C pixel circuit, and, of course, the pixel circuit may have a different structure in some other embodiments. FIG. 3 is a schematic diagram of a layout structure of the array substrate according to an embodiment of the present disclosure, FIG. 4 is a schematic diagram of the structure of an active layer of the array substrate according to an embodiment of the present disclosure, FIG. 5 is a schematic diagram of the structure of a first conductive layer of the array substrate according to an embodiment of the present disclosure, FIG. 6 is a schematic diagram of the structure of a second conductive layer of the array substrate according to an embodiment of the present disclosure, and FIG. 7 is a schematic diagram of the structure of the active layer stacked with the first conductive layer of the array substrate according to an embodiment of the present disclosure. With reference to FIGS. 2 to 7, The pixel circuit includes a light-emitting element, a drive circuit (with the drive circuit including the drive transistor T1 as an example), the first initialization transistor T5, the second initialization transistor T4, a threshold compensation circuit (with the threshold compensation circuit including a threshold compensation transistor T3 as an example), a data write circuit (with the data write circuit including the data write transistor T2 as an example), a first light emission control circuit (with the first light emission control circuit including a first light emission control transistor T6 as an example), a second light emission control circuit (with the second light emission control circuit including a second light emission control transistor T7 as an example), and a storage capacitor Cst. The control terminal of the drive transistor T1 is connected to the first terminal of the storage capacitor Cst, the second terminal of the drive transistor T1 is connected to the second terminal of the first light emission control transistor T6, and the second terminal of the drive transistor T1 is connected to the first terminal of the threshold compensation transistor T3. The first terminal of the data write transistor T2 is connected to a corresponding data line Data, the second terminal of the data write transistor T2 is connected to the first terminal of the drive transistor T1, and the second terminal of the data write transistor T2 is connected to a second scanning signal line S2. The second terminal of the threshold compensation transistor T3 is connected to the control terminal of the drive transistor T1, and the control terminal of the threshold compensation transistor T3 is connected to the second scanning signal line S2. The first terminal of the second initialization transistor T4 is connected to a corresponding first signal line, the second terminal of the second initialization transistor T4 is connected to the control terminal of the drive transistor T1, and the control terminal of the second initialization transistor T4 is connected to a first scanning signal line S1. In the layout, as shown in FIG. 6, both the second initialization transistor T4 and the third initialization transistor T3 are connected to the control terminal of the drive transistor T1 through a conductive connection line 50 disposed in the second conductive layer. The first terminal of the first initialization transistor T5 is connected to the first signal line, the second terminal of the first initialization circuit T5 is connected to the anode of the light-emitting element, and the control terminal of the first initialization circuit T5 is connected to a third scanning signal line S3. The first terminal of the first light emission control transistor T6 is connected to a power signal line Vdd, and the control terminal of the first light emission control transistor T6 is connected to an enable signal line EM. The first terminal of the second light emission control transistor T7 is connected to the second terminal of the drive transistor T1, the second terminal of the second light emission control transistor T7 is connected to the first electrode of the light-emitting element, and the control terminal of the second light emission control transistor T7 is connected to the enable signal line EM. The second terminal of the storage capacitor Cst is connected to the power signal line EM. The cathode of the light-emitting element is connected to a cathode signal line Vss.

Specifically, the operating process of the pixel circuit Px may include a first initialization stage, a data write stage, and a light emission stage. In the first initialization stage, the first scanning signal line S1 controls the second initialization transistor T4 to be turned on, and the first signal line Vref initializes the gate of the drive transistor T1.

In the data write stage, the second scanning signal line S2 controls the data write transistor T2 and the threshold compensation transistor T3 to be turned on, the data signal on the data line Data passes through the data write transistor T2, the drive transistor T1, and the threshold compensation transistor T3 and then is transmitted to the control terminal of the drive transistor T1, and when the voltage difference between the control terminal and the first terminal of the drive transistor T1 is the threshold voltage of the drive transistor, the drive transistor T1 is turned off to complete the threshold compensation process.

In the second initialization stage, the third scanning signal line S3 controls the first initialization transistor T5 to be turned on, and the first signal line Vref initializes the anode of the light-emitting element.

In the light emission stage, the enable signal line EM controls the first light emission control transistor T6 and the second light emission control transistor T7 to be turned on, the drive transistor T1 generates a drive current, and the light-emitting element emits light in response to the drive current.

Optionally, as shown in FIGS. 2 to 7, the array substrate includes an active layer, a first conductive layer, and a second conductive layer. The gates of all the above-mentioned transistors, the first plate of the storage capacitor, all the above-mentioned scanning signal lines, and the enable signal line are disposed in the first conductive layer. The power signal line Vdd, the first signal line Vref, and the data line Data are disposed in the second conductive layer. In this embodiment, the channels of all the above-mentioned transistors are formed in the active layer. The pixel circuit in this embodiment contains only two conductive layers, that is, the first conductive layer and the second conductive layer. Compared with the conventional setting of three or four conductive layers, the processes of the array substrate in this embodiment can be reduced due to fewer conductive layers, thereby saving process costs.

Optionally, as shown in FIGS. 2 to 7, the second initialization circuit T4 is a double-gate transistor, and since the leakage current of the double-gate transistor is small, the leakage of the drive transistor T1 can be reduced. Optionally, as shown in FIGS. 2 to 7, the threshold compensation transistor T3 is a double-gate transistor, thereby further reducing the leakage of the drive transistor T1. Of course, the threshold compensation transistor T3 may also be a single-gate transistor.

Figure 8:
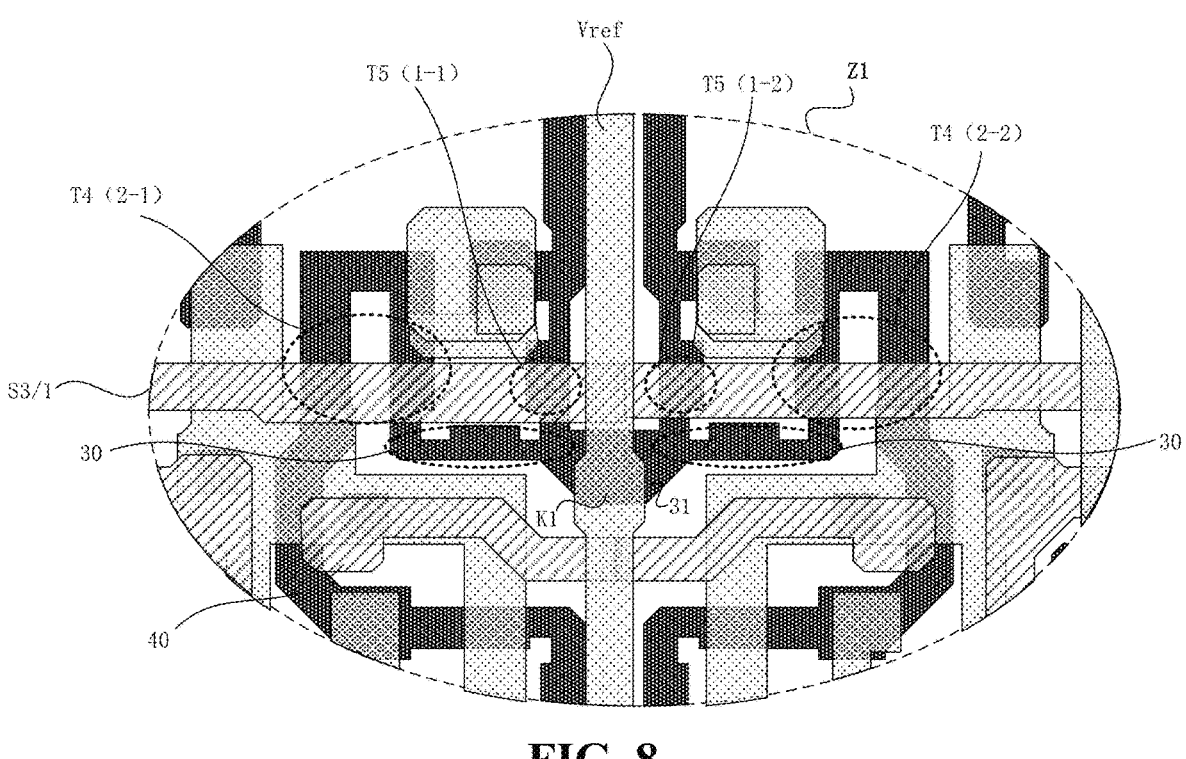
FIG. 8 is an enlarged view of a first region in FIG. 3.

Optionally, FIG. 8 is an enlarged view of a first region in FIG. 3. In conjunction with FIGS. 3 to 8, the first region Z1 in FIG. 8 includes first initialization circuits and second initialization circuits in two adjacent rows. For the pixel circuits Px in the same column in the repeating units 1 in two adjacent rows, the first initialization circuit in the pixel circuit Px in the i-th row and the j-th column and the second initialization circuit in the pixel circuit Px in the (i+1)-th row and the j-th column are connected to the first signal line Vref through the same first via hole K1, wherein i is a positive integer greater than or equal to 1, and j is a positive integer greater than or equal to 1. The first initialization circuit and the second initialization circuit in the pixel circuit in the i-th row and the j-th column are connected to the first signal line Vref through different first via holes K1.

Specifically, in this embodiment, in two repeating units in two adjacent rows, the first initialization transistor T5(1-1) in the pixel circuit in the first row and the first column, the first initialization transistor T5(1-2) in the pixel circuit in the first row and the second column, the second initialization transistor T4(1-2) in the pixel circuit in the second row and the first column, and the second initialization transistor T4(2-2) in the pixel circuit in the second row and the second column are all connected to the first signal line Vref through the same first via hole K1. Through such a setting, the number of first via holes corresponding to the first signal lines Vref can be reduced, thereby further reducing process costs. The wiring structure can also be simplified so that the size of the pixel circuit becomes smaller in the column direction, thereby further improving the pixel density.

Optionally, with reference to FIG. 8, the channel of the first initialization circuit T5 in the pixel circuit Px in the i-th row and the j-th column is disposed on a side of the channel of the second initialization circuit T4 in the pixel circuit Px in the (i+1)-th row and the j-th column closest to the first signal line Vref. Through such a setting, the pixel circuit Px becomes more compact in the lateral direction, and the wiring becomes easier, thereby further improving the pixel density of the array substrate.

Optionally, in some embodiments, with continued reference to FIG. 8, the channel of the first initialization circuit T5 in the pixel circuit Px in the i-th row and the j-th column and the channel of the second initialization circuit T4 in the pixel circuit Px in the (i+1)-th row and the j-th column are arranged in the row direction. Through such a setting, the pixel circuit Px becomes more compact in the longitudinal direction (that is, in the column direction), and the first initialization circuits of the pixel circuits in the i-th row and the second initialization circuits of the pixel circuits in the (i+1)-th row can be controlled simultaneously by using a single scanning signal line, that is, a reused signal line S1/3 (the first scanning signal line S1 is reused as the third scanning signal line S3) as shown in FIG. 8, thereby reducing the number of scanning signal lines. Exemplarily, the channel of the first initialization circuit in the pixel circuit in the i-th row and the j-th column and the channel of the second initialization circuit in the pixel circuit in the (i+1)-th row and the j-th column overlap the same scanning signal line (that is, the above-mentioned reused signal line S1/3).

Of course, in some other embodiments, the channel of the first initialization circuit in the pixel circuit in the i-th row and the j-th column and the channel of the second initialization circuit in the pixel circuit in the (i+1)-th row and the j-th column may also be set to overlap different scanning signal lines, respectively.

Optionally, as shown in FIG. 8, the channel of the first initialization circuit in the pixel circuit in the i-th row and the j-th column is disposed on a side, closest to the first via hole K1, of the channel of the second initialization circuit in the pixel circuit in the (i+1)-th row and the j-th column. Through such a setting, whether the first via hole K1 is connected to the pixel circuit in the i-th row and the j-th column or the pixel circuit in the (i+1)-th row and the j-th column, the first via hole K1 does not need to intersect other structures of the active layer, thereby reducing the wiring difficulty.

All of the above embodiments are described using the example where the first initialization circuit and the second initialization circuit share one first via hole. In some other embodiments, for pixel circuits in the same column in the repeating units in two adjacent rows, the first initialization circuit in the pixel circuit in the i-th row and the j-th column and the second initialization circuit in the pixel circuit in the (i+1)-th row and the j-th column may also be set to be connected to a respective one of the first signal lines through different first via holes. In this embodiment, although the first initialization circuit and the second initialization circuit are connected to different first via holes, the first initialization circuit and the corresponding second initialization circuit may be controlled by the same scanning signal line or by different scanning signal lines. In this embodiment, different initialization circuits are connected to different via holes so that the load of each via hole is small, thereby avoiding problems such as the damage caused by overheating when the via hole is overloaded.

Of course, on the basis of the above embodiments, exemplarily, for the pixel circuits Px in two adjacent rows, the first initialization circuit in the pixel circuit Px in the i-th row and the j-th column is connected to a corresponding first signal line Vref through via first via hole (not shown), and the second initialization circuit in the pixel circuit Px in the (i+1)-th row and the j-th column is connected to a corresponding first signal line Vref through a first second via hole (not shown).

Further, the first via hole and the first second via hole are disposed on a side, facing the pixel circuit in the (i+1)-th row and the j-th column, of the channel of the first initialization circuit in the pixel circuit in the i-th row and the j-th column. Through such a setting, the connection line between the first via hole and the repeating unit in the first row and the connection line between the first second via hole and the repeating unit in the second row do not need to intersect one another and do not need to intersect the other structures of the active layer, thereby reducing the wiring difficulty.

Optionally, the first second via hole is disposed on a side, facing the pixel circuit in the (i+1)-th row and the j-th column, of the first via hole, thereby preventing the connection line between the first via hole and the repeating unit in the first row and the connection line between the first second via hole and the pixel circuit in the (i+1)-th row and the j-th column from intersecting one another.

Optionally, the channel of the first initialization circuit in the pixel circuit in the i-th row and the j-th column is disposed on a side, closest the first signal line, of the channel of the second initialization circuit in the pixel circuit in the (i+1)-th row and the j-th column. Through such a setting, the pixel circuit Px becomes more compact in the lateral direction, and the wiring becomes easier, thereby further improving the pixel density of the array substrate.

Optionally, in some embodiments, the channel of the first initialization circuit in the pixel circuit in the i-th row and the j-th column and the channel of the second initialization circuit in the pixel circuit in the (i+1)-th row and the j-th column are arranged in the row direction. Through such a setting, the pixel circuit Px becomes more compact in the longitudinal direction (that is, in the column direction), and the first initialization circuit in the pixel circuit in the i-th row and the j-th column and the second initialization circuit in the pixel circuit in the (i+1)-th row and the j-th column can be controlled simultaneously by using a single scanning signal line, thereby reducing the number of scanning signal lines. Exemplarily, the channel of the first initialization circuit in the pixel circuit in the i-th row and the j-th column and the channel of the second initialization circuit in the pixel circuit in the (i+1)-th row and the j-th column overlap the same scanning signal line.

Of course, in some other embodiments, the channel of the first initialization circuit in the pixel circuit in the i-th row and the j-th column and the channel of the second initialization circuit in the pixel circuit in the (i+1)-th row and the j-th column may also be set to overlap different scanning signal lines, respectively. In this embodiment, the scanning signal lines are not shared between different pixel circuits such that the load corresponding to each scanning signal line is small and the voltage drop on the scanning signal line can be further reduced, thereby further improving the display uniformity.

Optionally, with reference to FIGS. 3 to 7, two pixel circuits in each repeating unit are mirror-symmetric. By setting the pixel circuits Px symmetrically, the distance between the first signal line Vref and each pixel circuit Px can be closer or even equal to each other to further reduce the difference in initialization of each pixel circuit Px, thereby improving the display uniformity of the array substrate.

Further, as shown in FIG. 3, each first signal line Vref is disposed on the center line of the two pixel circuits Px of the respective repeating unit. In other words, the first signal line Vref is disposed on the center line of the corresponding column of repeating units 1 so that the length of the connection line between each pixel circuit Px in each column and the corresponding first signal line Vref is equal, thereby resulting in high consistency in initialization of each pixel circuit Px and high display uniformity of the array substrate.

Optionally, of course, the width of the portion of the first signal line Vref corresponding to the connection via hole is greater than the width of the remaining portion of the first signal line Vref, thereby ensuring the stability of the connection between the first signal line Vref and the via hole.

Optionally, for the pixel circuits Px in the same column in the repeating units 1 in two adjacent rows, the first initialization circuit in the pixel circuit Px in the i-th row and the j-th column and the second initialization circuit in the pixel circuit Px in the (i+1)-th row and the j-th column are connected to a respective one of the first signal lines Vref through the same first via hole. Each repeating unit 1 is provided with two first conductive structure 30, and a second conductive structure 31 is further disposed between the two pixel circuits Px of each repeating unit 1. The second conductive structure 31 is connected to the first signal line Vref through the via hole K1. One of the first conductive structures 30 is connected to the first initialization circuit in the pixel circuit Px in the i-th row and the j-th column and the second initialization circuit in the pixel circuit Px in the (i+1)-th row and the j-th column and is connected to the second conductive structure 31. The other one of the two first conductive structures 30 is connected to a first initialization circuit in a pixel circuit Px in the i-th row and a (j+1)-th column and a second initialization circuit in a pixel circuit Px in the (i+1)-th row and the (j+1)-th column and is connected to the second conductive structure. The first conductive structure 30 connected to the first initialization circuit does not overlap a conductive signal line.

Specifically, taking FIG. 8 as an example, the first initialization circuit and the corresponding second initialization circuit in FIG. 8 are connected to the same first conductive structure 30, the first conductive structures 30 in the same repeating unit are both connected to the second conductive structure 31, and the second conductive structure 31 is connected to the first signal line Vref through the first via hole K1. Of course, this embodiment is not limited thereto, that is, the first initialization circuit and the second initialization circuit may be connected to the same first via hole or different first via holes through different conductive structures. The conductive signal line is, for example, a first signal line Vref, a data line Data or a power signal line Vdd. When the conductive signal line overlaps the first conductive structure, the conductive signal line interferes with the first conductive structure, and the signal transmission on the conductive signal line has a great impact on the signal transmission on the first conductive structure. Therefore, in this embodiment, by setting the conductive structure not to overlap the first conductive signal, the stability of the initialization signal transmission on the first conductive structure can be improved, thereby ensuring the initialization effect of each pixel circuit Px and enabling the pixel circuits Px to be initialized more completely. In the above embodiments, the first conductive structure 30 extends in the row direction X, and the first conductive structure 30 and the second conductive structure 31 are disposed in the same layer; the first conductive structure 30 and the second conductive structure 31 are located in the active layer.

Optionally, with reference to FIGS. 3 to 8, the array substrate further includes multiple data lines Data extending in the column direction Y. The pixel circuits Px of each column are connected to a respective one of the data lines Data. Two data lines Data are disposed between every two adjacent columns of repeating units 1. Two data lines Data are disposed between every two adjacent first signal lines Vref. As shown in FIG. 3, each column of pixel circuits Px is connected to a closer data line Data. In this embodiment, the first signal lines Vref and the data lines Data are disposed in the same layer and both are disposed in the second conductive layer. The data line Data is connected to a corresponding data write transistor T2 through a first via hole.

Figure 9:
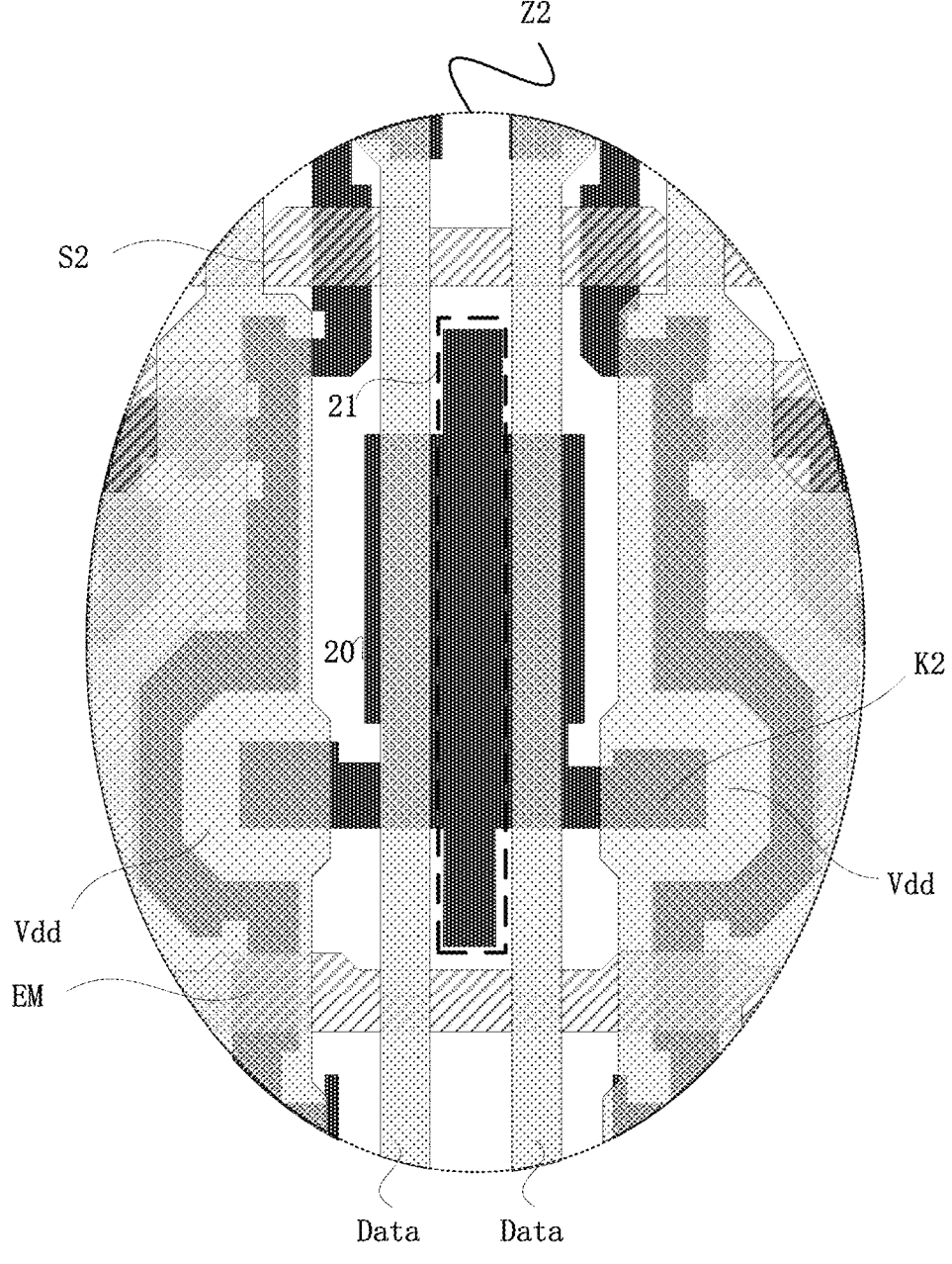
FIG. 9 is an enlarged view of a second region in FIG. 3.

Further, FIG. 9 is an enlarged view of a second region in FIG. 3. With reference to FIGS. 3 and 9, the second region Z2 in FIG. 3 includes at least one shielding structure 20. In this embodiment, a shielding structure 20 is disposed between two adjacent columns of repeating units. In the thickness direction of the array substrate, the projection of two data lines between two adjacent columns of repeating units overlaps the projection of the shielding structure 20.

Specifically, the shielding structure 20 may be disposed between any two adjacent repeating units 1, and the shielding structure 20 and the data lines Data may form a line capacitance. In this manner, the data signal on the data line Data can be preserved for a certain period of time, that is, to achieve the 'line charging' effect; in addition, the shielding structure 20 can shield the coupling between two adjacent data lines Data. In some embodiments, the shielding structure 20 is disposed in the active layer, and accordingly, the shielding structure 20 is made of the material of the active layer. In some other embodiments, the shielding structure 20 may also be disposed in the first conductive layer, and accordingly, the shielding structure 20 is made of the material of the first conductive layer. Further, the shielding structure 20 accesses a fixed potential, thereby making the formed line capacitance more stable and improving the effect of shielding the coupling between the data lines Data.

Optionally, with reference to FIGS. 3 to 9, the array substrate further includes power signal lines Vdd extending in the column direction and at least one second via hole K2. The power signal line Vdd is used for supplying a power signal to a respective column of the pixel circuits. The power signal lines Vdd and the shielding structure 20 are disposed in different layers, and the shielding structure 20 is connected to the power signal line Vdd through the second via hole K2. In this embodiment, as shown in FIG. 9, each column of pixel circuits Px corresponds to one power signal line Vdd, the shielding structure 20 overlaps two adjacent power signal lines Vdd, and the shielding structure may access the power signal by connecting at least one power signal line Vdd through a via hole.

Optionally, with continued reference to FIGS. 3 to 9, the array substrate further includes at least one coupling suppression structure 21 extending in the column direction Y and disposed between two adjacent columns of repeating units 1. The coupling suppression structure 21 and the data lines Data are disposed in different layers, and in a plan view the coupling suppression structure 21 is located between two data lines Data disposed between two adjacent columns of repeating units 1.

Specifically, the coupling suppression structure 21 has the effect of suppressing the coupling of two adjacent data lines Data, that is, the data lines are coupled with the coupling suppression structure 21 and no data coupling occurs between the two data lines Data, thereby ensuring the stability of the signal on the data line Data. In the above embodiments, the coupling suppression structure 21 is integrated with the shielding structure 20. When the shielding structure 20 is disposed in the active layer, the coupling suppression structure 21 is disposed in the active layer; when the shielding structure 20 is disposed in the first conductive layer, the coupling suppression structure 21 is disposed in the first conductive layer. The coupling suppression structure 21 accesses a fixed potential through the shielding structure 20, for example, accesses the power signal on the power signal line Vdd.

Optionally, with continued reference to FIGS. 3 to 9, the array substrate further includes a scanning signal line extending in the row direction X. In the thickness direction of the array substrate, the coupling suppression structure 21 or the shielding structure 29 is spaced from the projection of the scanning signal line and the projection of the enable signal line EM.

Specifically, in the column direction Y, the longer the length of the coupling suppression structure 21, the better the coupling suppression effect. However, if the coupling suppression structure 21 overlaps the scanning signal line or the enable signal line EM, the load on the corresponding signal line is increased, thereby affecting the display effect. Therefore, in this embodiment, the length of the coupling suppression structure 21 is extended as much as possible on the premise that the coupling suppression structure 21 does not overlap the scanning signal line and the enable signal line EM, thereby achieving a great coupling suppression effect without increasing the load on the corresponding laterally extended signal line.

Optionally, with reference to FIGS. 3 to 9, the power signal lines Vdd may be disposed in the second conductive layer, that is, the power signal lines Vdd, the first signal lines Vref, and the data lines Data all extend in the column direction Y and are all disposed in the second conductive layer. Each column of pixel circuits corresponds to a power signal line Vdd. The power signal line Vdd is disposed between the data line Data and the first signal line Vref. The first signal line Vref is disposed between two adjacent power signal lines Vdd, and two data lines Data between two adjacent columns of repeating units 1 are disposed between two adjacent power signal lines Vdd. In this embodiment, the power signal line Vdd is integrated with the second plate of the storage capacitor Cst, thereby further improving the degree of integration, reducing the overall area of the pixel circuit Px, and helping improve the pixel density.

Optionally, as shown in FIGS. 5 and 8, the array substrate further includes a plurality of power bonding lines disposed in the first conductive layer, and two adjacent power signal lines Vdd are connected to each other through the power bonding line. The power bonding line may include a first power bonding line 40 and a second power bonding line 41, and two adjacent power signal lines are connected to each other through the first power bonding line 40 or the second power bonding line 41. By setting the first power bonding line 40 and the second power bonding line 41, the power signal lines Vdd in the array substrate are connected into a mesh structure, thereby further improving the uniformity of the power signals on the power signal lines Vdd in the array substrate.

An embodiment of the present disclosure further provides an array substrate. The array substrate may include at least one repeating unit and a plurality of first signal lines. Each repeating unit includes two pixel circuits adjacent to each other in a first direction, and each pixel circuit includes multiple function circuits. The multiple function circuits in each repeating unit are connected to the same first signal.

Further, part of the at least one repeating unit is arranged in a second direction, and the second direction intersects the first direction; the first signal line extends in the second direction; multiple function circuits in the part of the at least one repeating unit arranged in the second direction are connected to the same first signal line. In an embodiment, the first direction is the row direction, and the second direction is the column direction. In another embodiment, the first direction is the column direction, and the second direction is the row direction. The at least one repeating unit may include multiple repeating units, and the multiple repeating units are arranged in an array.

An embodiment of the present disclosure further provides a display panel. The display panel includes the array substrate provided by any embodiment of the present disclosure. Since the display panel provided by the embodiment of the present disclosure includes the array substrate provided by any embodiment of the present disclosure, the display panel also has the same beneficial effects as the array substrate, and the details are not repeated here.

Figure 10:
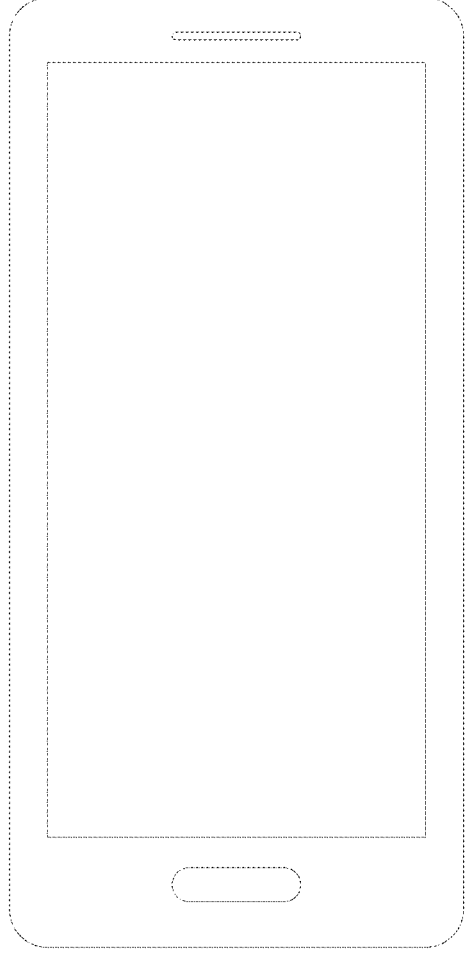
FIG. 10 is a schematic diagram of the structure of a display assembly according to an embodiment of the present disclosure.

An embodiment of the present disclosure further provides a display assembly. As shown in FIG. 10 which is a schematic diagram of the structure of a display assembly according to an embodiment of the present disclosure, the display assembly includes the array substrate provided by any embodiment of the present disclosure, and the display assembly may also include a touch layer, a cover plate, and the like.

The preceding embodiments are not construed as a limitation of the scope of the present disclosure. It is to be understood by those skilled in the art that various modifications, combinations, sub-combinations, and substitutions may be made according to design requirements and other factors. Any modifications, equivalent substitutions, improvements and the like made within the spirit and principle of the present disclosure are within the scope of the present disclosure.

What is claimed is:

1. An array substrate, comprising:
a plurality of repeating units arranged in an array, wherein each repeating unit of the plurality of repeating units comprises two pixel circuits disposed in two adjacent columns, and each pixel circuit of the two pixel circuits comprises a plurality of function circuits; and
a plurality of first signal lines extending in a column direction;
wherein the plurality of function circuits in the each pixel circuit at least comprise a first initialization circuit or a second initialization circuit; in the each repeating unit, first initialization circuits in the two pixel circuits are connected to a same first signal line, or second initialization circuits in the two pixel circuits are connected to a same first signal line;
wherein the array substrate further comprises a plurality of data lines extending in the column direction, and pixel circuits of each column are connected to a respective data line of the plurality of data lines;
wherein the plurality of data lines and the plurality of first signal lines are disposed in a same layer;
wherein the array substrate comprises an active layer, a first conductive layer, and a second conductive layer, and the plurality of data lines and the plurality of first signal lines are disposed in the second conductive layer;
wherein two data lines are disposed between every two adjacent columns of repeating units; and the two data lines are disposed between every two adjacent first signal lines;
wherein the array substrate further comprises at least one shielding structure disposed between the two adjacent columns of repeating units, wherein in a thickness direction of the array substrate, a projection of the two data lines between the two adjacent columns of repeating units overlaps a projection of the at least one shielding structure between the two adjacent columns of repeating units; and wherein the shielding structure is disposed in the active layer or the first conductive layer.

2. The array substrate according to claim 1, wherein each of the plurality of first signal lines is disposed between two pixel circuits of a respective one of the plurality of repeating units;
the plurality of function circuits in the each pixel circuit at least comprise a first initialization circuit and a second initialization circuit.

3. The array substrate according to claim 2, wherein
the array substrate further comprises a plurality of first via holes, the plurality of function circuits in the each repeating unit are connected to a first signal line through a respective one of plurality of first via holes; and
the first via hole corresponding to the plurality of function circuits in the each repeating unit is disposed between the two pixel circuits of the each repeating unit;
in the each repeating unit, first initialization circuits in the two pixel circuits are connected to the first signal line through one first via hole, and second initialization circuits in the two pixel circuits are connected to the respective first signal line through another one first via hole; and
for repeating units in two adjacent rows and a same column, a first initialization circuit in a pixel circuit in an i-th row and a j-th column and a second initialization circuit in a pixel circuit in an (i+1)-th row and the j-th column are connected to the respective first signal line through a same first via hole; the first initialization circuit and a second initialization circuit in the pixel circuit in the i-th row and the j-th column are connected to the first signal line through different first via holes, wherein i is a positive integer greater than or equal to 1, and j is a positive integer greater than or equal to 1.

4. The array substrate according to claim 3, wherein the each pixel circuit comprises a drive circuit, the first initialization circuit is used for initializing a first electrode of a light-emitting element, and the second initialization circuit is used for initializing the drive circuit; and
both the first initialization circuit and the second initialization circuit comprise a transistor, the transistor comprises a channel, and a channel of the first initialization circuit in the pixel circuit in the i-th row and the j-th column is disposed on a side of a channel of the second initialization circuit in the pixel circuit in the (i+1)-th row and the j-th column closest to the first signal line.

5. The array substrate according to claim 1, wherein the plurality of function circuits in the each pixel circuit at least comprise a first initialization circuit and a second initialization circuit, each of the first initialization circuit and the second initialization circuit comprises a transistor, the transistor comprises a channel, and for repeating units in two adjacent rows and a same column, a channel of a first initialization circuit in a repeating unit in a first row and a channel of a second initialization circuit in a repeating unit in a second row are arranged in a row direction; and
the array substrate comprises a plurality of scanning signal lines extending in the row direction, and the plurality of scanning signal lines and the plurality of first signal lines are disposed in different conductive layers; the channel of the first initialization circuit in the repeating unit in the first row and the channel of the second initialization circuit in the repeating unit in the second row overlap a same scanning signal line.

6. The array substrate according to claim 1, wherein the two pixel circuits in the each repeating unit are mirror-symmetric; each of the plurality of first signal lines is disposed on a center line of the two pixel circuits of the respective repeating unit.

7. The array substrate according to claim 3, wherein the each repeating unit is provided with two first conductive structures and a second conductive structure disposed between the two pixel circuits of the each repeating unit, and the second conductive structure is connected to the first signal line through the first via hole;

one of the two first conductive structures is connected to:

the first initialization circuit in the pixel circuit in the i-th row and the j-th column, and the second initialization circuit in the pixel circuit in the (i+1)-th row and the j-th column, and the second conductive structure;

the other one of the two first conductive structures is connected to:

a first initialization circuit in a pixel circuit in the i-th row and a (j+1)-th column, and a second initialization circuit in a pixel circuit in the (i+1)-th row and the (j+1)-th column, and the second conductive structure;

the first conductive structure connected to the first initialization circuit does not overlap a conductive signal line; and the conductive signal line comprises the first signal line, a data line and a power signal line.

8. The array substrate according to claim 7, wherein the first conductive structures extend in a row direction; and the array substrate comprises an active layer, a first conductive layer and a second conductive layer, and the first conductive structures and the second conductive structure are disposed in the active layer.

9. The array substrate according to claim 1, wherein the array substrate further comprises a plurality of power signal lines extending in the column direction and at least one second via hole, each power signal line of the plurality of power signal lines is used for supplying a power signal to a respective column of pixel circuits, the power signal lines and the shielding structure are disposed in different layers, and the shielding structure is connected to one of the plurality of power signal lines through the second via hole.

10. The array substrate according to claim 9, further comprising at least one coupling suppression structure extending in the column direction and disposed between two adjacent columns of repeating units; the coupling suppression structure and the plurality of data lines are disposed in different layers, and in a plan view the coupling suppression structure is located between the two data lines disposed between the two adjacent columns of repeating units;

the coupling suppression structure is disposed in the active layer or the first conductive layer; and the coupling suppression structure is integrated with the shielding structure.

11. The array substrate according to claim 1, wherein the array substrate further comprises a plurality of power signal lines extending in the column direction, pixel circuits of each column are connected to a respective one of the plurality of power signal lines, and each of the plurality of power signal lines is used for supplying a power signal to the pixel circuits;

the plurality of power signal lines and the plurality of first signal lines are disposed in a same layer.

12. The array substrate according to claim 11, wherein the array substrate further comprises a plurality of power bonding lines disposed in the first conductive layer, and two adjacent power signal lines of the plurality of power signal lines are connected to each other through the power bonding line.

13. The array substrate according to claim 11, wherein each of the plurality of first signal lines is disposed between two adjacent power signal lines of the plurality of power signal lines; and the two data lines between two adjacent columns of repeating units are disposed between two adjacent power signal lines of the plurality of power signal lines.

14. The array substrate according to claim 11, wherein each of the two pixel circuits comprises a drive circuit, a first initialization circuit, a second initialization circuit, a threshold compensation circuit, a data write circuit, a first light emission control circuit, a second light emission control circuit, and a storage capacitor;

wherein a control terminal of the drive circuit is connected to a first terminal of the storage capacitor, a first terminal of the drive circuit is connected to a second terminal of the first light emission control circuit, and a second terminal of the drive circuit is connected to a first terminal of the threshold compensation circuit;

wherein a first terminal of the data write circuit is connected to a corresponding data line, a second terminal of the data write circuit is connected to the first terminal of the drive circuit, and a control terminal of the data write circuit is connected to a second scanning signal line;

wherein a second terminal of the threshold compensation circuit is connected to the control terminal of the drive circuit, and a control terminal of the threshold compensation circuit is connected to the second scanning signal line;

wherein a first terminal of the second initialization circuit is connected to a corresponding first signal line, or a first terminal of the first initialization circuit is connected to the first signal line;

wherein a second terminal of the second initialization circuit is connected to the control terminal of the drive circuit;

wherein a control terminal of the second initialization circuit is connected to a first scanning signal line;

wherein a second terminal of the first initialization circuit is connected to an anode of a light-emitting element;

wherein a first terminal of the first light emission control circuit is connected to the power signal line, and a control terminal of the first light emission control circuit is connected to an enable signal line;

wherein a first terminal of the second light emission control circuit is connected to the second terminal of the drive circuit, a second terminal of the second light emission control circuit is connected to the anode of the light-emitting element, and a control terminal of the second light emission control circuit is connected to the enable signal line; and wherein a second terminal of the storage capacitor is connected to the power signal line.

15. The array substrate according to claim 1, wherein the plurality of function circuits in each pixel circuit at least comprise a first initialization circuit and a second initialization circuit;

wherein in the each repeating unit, first initialization circuits in the two pixel circuits and second initialization circuits in the two pixel circuits are connected to a same first signal line among the plurality of first signal lines, and wherein the first initialization circuits and the second initialization circuits in the repeating units of each column among the plurality of repeating units are connected to a same first signal line among the plurality of first signal lines.

16. The array substrate according to claim 1, wherein in a non-display area, each first signal line is connected to a driver chip through a corresponding lead, in a display area, any two first signal lines are not connected to each other through a lead extending in a row direction.

17. An array substrate, comprising:

a plurality of repeating units arranged in an array, wherein each repeating unit of the plurality of repeating units comprises two pixel circuits disposed in two adjacent columns, and each pixel circuit of the two pixel circuits comprises a plurality of function circuits; and a plurality of first signal lines extending in a column direction, wherein the plurality of function circuits in each pixel circuit at least comprise a drive circuit, a first initialization circuit for initializing a first electrode of a light-emitting element, and a second initialization circuit for initializing the drive circuit;

wherein in each repeating unit of the plurality of repeating units, first initialization circuits in the two pixel circuits and second initialization circuits in the two pixel circuits are connected to a same first signal line among the plurality of first signal lines;

wherein the first initialization circuits and the second initialization circuits in the repeating units of each column among the plurality of repeating units are connected to a same first signal line among the plurality of first signal lines;

wherein the array substrate further comprises a plurality of data lines extending in the column direction, and pixel circuits of each column are connected to a respective one of the plurality of data lines;

wherein the plurality of data lines and the plurality of first signal lines are disposed in a same layer;

wherein the array substrate comprises an active layer, a first conductive layer, and a second conductive layer, and the plurality of data lines and the plurality of first signal lines are disposed in the second conductive layer;

wherein two data lines are disposed between every two adjacent columns of repeating units; and the two data lines are disposed between every two adjacent first signal lines;

wherein the array substrate further comprises a plurality of power signal lines extending in the column direction, and pixel circuits of each column are connected to a respective one of the plurality of power signal lines, and each of the plurality of power signal lines is used for supplying a power signal to the pixel circuits; and wherein the plurality of power signal lines and the plurality of first signal lines are disposed in the same layer;

wherein each of the plurality of first signal lines is disposed between two adjacent power signal lines among the plurality of power signal lines;

wherein the two data lines between two adjacent columns of repeating units are disposed between two adjacent power signal lines among the plurality of power signal lines; and wherein each of the plurality of first signal lines is disposed between two pixel circuits of a respective one of the plurality of repeating units.

18. An array substrate, comprising:

a plurality of repeating units arranged in an array, wherein each repeating unit of the plurality of repeating units comprises two pixel circuits disposed in two adjacent columns, and each pixel circuit of the two pixel circuits comprises a plurality of function circuits; and a plurality of first signal lines extending in a column direction, wherein the plurality of function circuits in repeating units of each column are connected to a respective first signal line of the plurality of first signal lines, and the plurality of function circuits in the each repeating unit are connected to a same first signal line;

wherein each of the plurality of first signal lines is disposed between two pixel circuits of a respective one of the plurality of repeating units;

wherein the array substrate further comprises a plurality of first via holes, the plurality of function circuits in the each repeating unit are connected to a first signal line through a respective one of plurality of first via holes; and the first via hole corresponding to the plurality of function circuits in the each repeating unit is disposed between the two pixel circuits of the each repeating unit;

wherein the plurality of function circuits in each pixel circuit at least comprise a first initialization circuit and a second initialization circuit; and wherein in the each repeating unit, first initialization circuits in the two pixel circuits are connected to the first signal line through one first via hole, and second initialization circuits in the two pixel circuits are connected to the respective first signal line through another one first via hole; and for repeating units in two adjacent rows and a same column, a first initialization circuit in a pixel circuit in an i-th row and a j-th column and a second initialization circuit in a pixel circuit in an (i+1)-th row and the j-th column are connected to the respective first signal line through a same first via hole; the first initialization circuit and a second initialization circuit in the pixel circuit in the i-th row and the j-th column are connected to the first signal line through different first via holes, wherein i is a positive integer greater than or equal to 1, and j is a positive integer greater than or equal to 1.

* * * * *